United States Patent [19]

Brewer

[11] Patent Number: 4,539,567

[45] Date of Patent: Sep. 3, 1985

[54] MICROWAVE MONITOR

[75] Inventor: Richard D. Brewer, Corona Del Mar, Calif.

[73] Assignee: Micrometrics, Ltd., Irvine, Calif.

[21] Appl. No.: 531,260

[22] Filed: Sep. 12, 1983

[51] Int. Cl.³ .............................................. G01S 3/02
[52] U.S. Cl. .................................... 343/351; 343/703; 343/718
[58] Field of Search .................... 343/351, 703, 718; 324/72.5, 95; 455/226

[56] References Cited

U.S. PATENT DOCUMENTS

| | | |
|---|---|---|
| 3,639,841 | 2/1972 | Richardson . |
| 3,737,905 | 6/1973 | Haroules et al. ...................... 343/351 |
| 3,753,116 | 8/1973 | Kolbly ................................. 325/363 |
| 3,760,271 | 9/1973 | Bach, Jr. et al. . |
| 3,783,448 | 1/1974 | Brodwin . |
| 3,931,573 | 1/1976 | Hopfer . |
| 4,044,303 | 8/1977 | Reindel . |
| 4,301,406 | 11/1981 | Shriner . |
| 4,338,595 | 7/1982 | Newman . |
| 4,368,472 | 1/1983 | Gandhi ................................ 343/718 |

OTHER PUBLICATIONS

±1 db Flatness Achieved in Broadband Sensor, *Microwaves*, Nov. 1971.

*Primary Examiner*—Theodore M. Blum
*Attorney, Agent, or Firm*—Hubbard, Stetina & Brunda

[57] ABSTRACT

An improved microwave field monitor device is disclosed characterized by use of a microstrip antenna and control electronics adapted to provide a field alarm, field monitor, accumulated dose alarm, and integrated dose indication of RF radiation exposure to an individual. The monitor is packaged in a small configuration similar to an identification badge adapted to be easily affixed to the clothing of a user. The monitor additionally is capable of measuring the RF radiation exposure at particular part or whole body resonance frequency bands or standing wave hot spots known to be hazardous to individuals.

12 Claims, 4 Drawing Figures

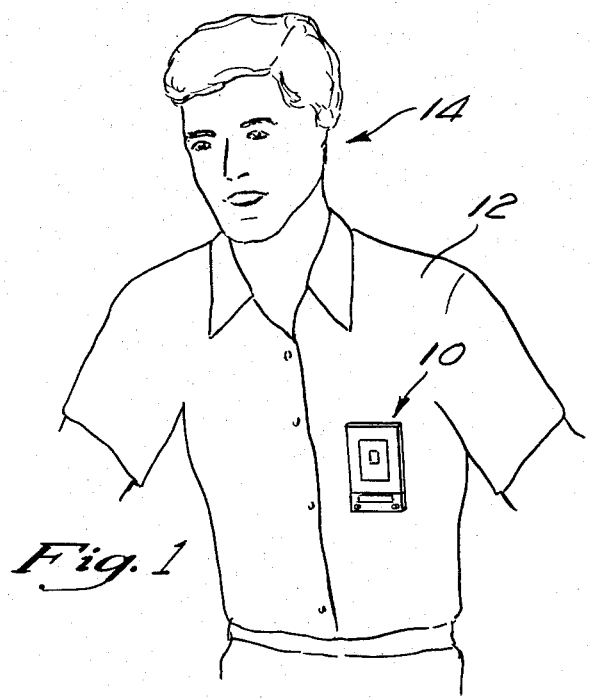
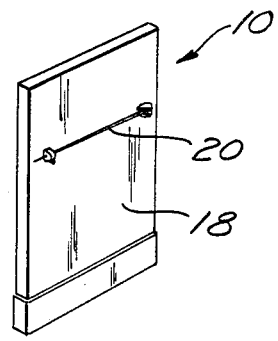
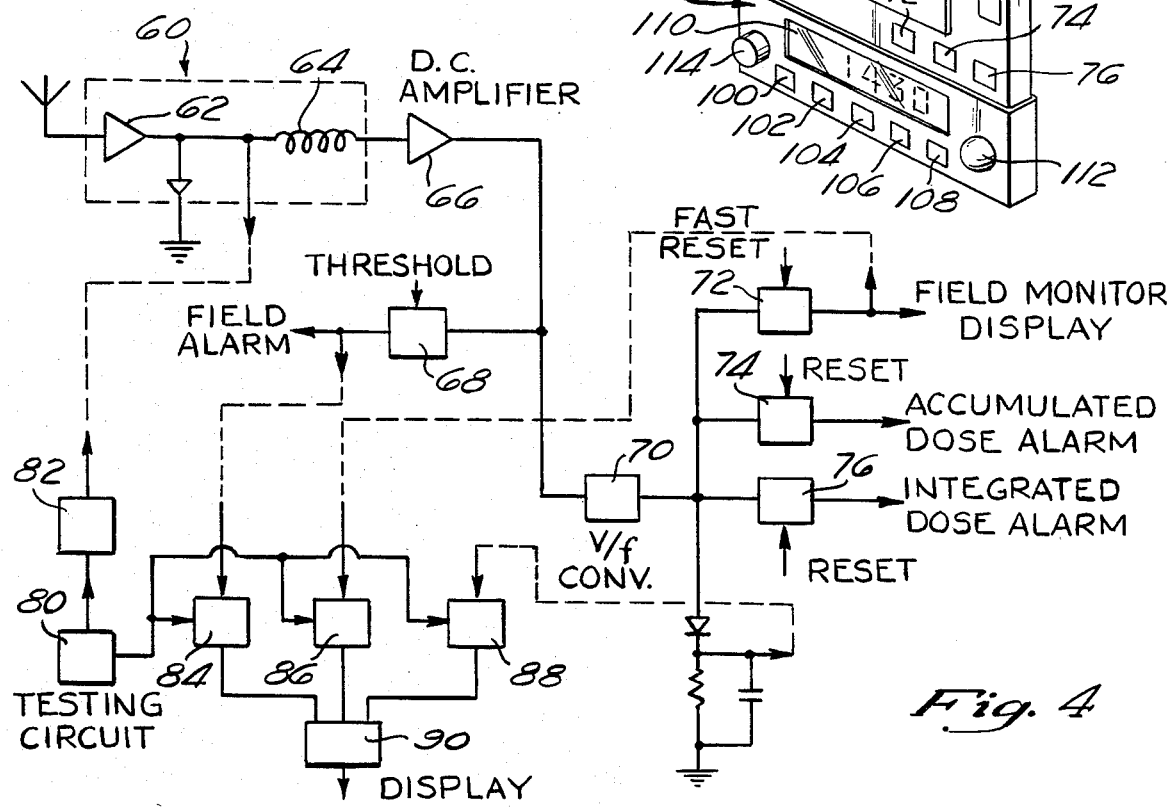

MICROWAVE MONITOR

BACKGROUND OF THE PRESENT INVENTION

The present invention relates to microwave measurement devices and more particularly to a small personal microwave monitor device characterized by use of a microstrip antenna and control electronics adapted to provide a field alarm, field monitor, accumulated dose alarm, and integrated dose indication of RF radiation exposure to individuals.

As is well known, there has been a dramatic increase in the use of microwave RF radiation in recent years, both in military, medical, residential, and industrial applications. Although this increase has resulted in substantial technological improvements in these fields, it has raised concern over the biological hazards of RF radiation exposure to individuals.

Recognition of this concern has promulgated regulations by various national authorities attempting to define the maximum permissable exposure of individuals to such radiation. To date, most of these regulations have dictated permissable whole body resonance exposure standards for individuals which have typically placed an average specific absorbtion level (SAR) limit on exposure in the amount of approximately 0.4 W/Kg throughout a frequency range of 0.3 to 3,000 MHz. However, more recently, the American National Standards Institute Committee has recognized that certain non-uniform heating or "hot-spot" values and part body resonances exist within particular frequency bands for which the SAR limit is in actuality too high to positively prevent biological damage to certain body parts such as the head of individuals. Thus, a need in the art exists for a microwave monitor device which is capable of accurately measuring the radiation exposure levels to individuals both throughout the normal frequency ranges of microwave radiation as well as the hot spot frequency bands.

Although this need has been recognized to a limited extent in the prior art, the microwave monitor devices to date can basically be categorized into three groups, the first being sophisticated laboratory field probes the second being portable survey monitors and the third being generic microwave monitor such as crystal monitors. The prior art sophisticated laboratory field probes and survey monitors have typically proven to be very expensive, do not accumulate exposure and are cumbersome to use in field enviroments since they require use of both hands of an individual and full attention during operation. In addition, the crystal monitors, although being substantially less expensive than the sophisticated laboratory instruments, have typically proven extremely inaccurate and thereby unreliable for field testing.

Therefore, there remains a substantial need in the art for a relatively small, portable, low-cost field monitoring device capable of accurately and continuously measuring and accumulating the exposure levels of RF radiation at specific partial body resonance frequency bands associated with hazardous "hot spots".

SUMMARY OF THE PRESENT INVENTION

The present invention specifically addresses and alleviates the above-referenced deficiencies associated in the art. More particularly, the present invention provides an improved microwave field monitor device characterized by use of a microstrip antenna and control electronics to provide a field alarm, field monitor, accumulated dose alarm, and integrated dose indication of RF radiation exposure to an individual. Due to the incorporation of the microstrip antenna and electronics, the monitor of the present invention can be packaged in an extremely small configuration having typical dimensions of less than $2\frac{1}{2}$ inch by 4 inch by $\frac{1}{4}$ inch and is preferably formed in an identification badge format adapted to be affixed the clothing of a user. The monitor of the present invention is designed for peak efficiency at specific body resonances of interest with the associated detectors, strip line feeds, and matching networks formed on a thin planer module which accumulates, stores, and reads back on demand the field levels for each frequency band as well as providing a warning alarm upon exposure to radiation fields in excess of the user's predetermined specified value.

In the preferred embodiment, the microstrip antenna element is basically a sandwich of two parallel conducting layers separated by a single thin dielectric substrate. Various antenna geometries may be utilized which directly relate to the antenna performance parameters of resonant frequency, band width, efficiency, polarization and gain. The antenna is integrated into a system that rectifies the received field levels, accumulates and stores for later display the exposure in calibrated terms for each desired resonance frequency. In order to accumulate voltage levels in excess of the specified threshhold, the electronic system stores the same for each resonance to provide the capability to display the accumulation upon demand.

Due to the microwave antenna and electronic system, the present invention provides a relatively small, readily portable, microwave monitor which possesses the high accuracy necessary for meaningful field exposure data and excessive exposure warning. In addition, due to the microwave monitor of the present invention enabling the detection of radiation exposure at specific frequency bands, the present invention is extremely suitable for the monitoring of the partial body resonance frequencies and associated "hot spot" hazards due to absorption of the microwave radiation. In addition, by use of mass production techniques, the overall cost of the microwave monitor of the present invention may be maintained at the values enabling its widespread use.

DESCRIPTION OF THE DRAWINGS

These as well as other features of the present invention will become more apparent upon reference to the drawings, wherein:

FIG. 1 is a perspective view of the improved microwave monitor of the present invention disposed upon an individual user;

FIG. 2 is a rear perspective view of the improved microwave monitor of the present invention;

FIG. 3 is an enlarged front perspective view of the microwave monitor of the present invention; and FIG. 4 is an electrical schematic of a representative channel of the improved microwave monitor of the present invention.

DETAILED DESCRIPTION OF THE PREFERRED EMBODIMENT

Referring to FIGS. 1 through 3, there is shown the improved microwave field monitor device 10 of the present invention which in the preferred embodiment is packaged in an extremely small configuration having approximate dimensions of two and one-half inches by four inches by one-fourth inch so as to be capable of being affixed to the clothing 12 of a user 14. By way of example and not limitation, the monitor 10 is preferably formed having a rectangular housing defined by a front surface 16 and rear surface 18. As best shown in FIGS. 2 and 3, the rear surface 18 is provided with a conventional non-electrically conductive pin and latch assembly designated generally by the numeral 20 which may be attached to the clothing 12 of a user while the frontal surface 16 includes a control and display portion 22 positioned adjacent the lower end of the monitor 10 and a antenna portion 24. In the preferred embodiment, the antenna portion 24 may include suitable indicia 26 such as the name, identification number or code of an individual or company whereby the monitor 10 may function as an identification badge for the user 14.

The working components of the monitor 10 basically comprise two parts: the multispectral RF head or antenna designated generally by the numeral 30 adapted to collect radiation energy exposed upon the monitor 10 and the control electronic section or system 60 (shown in FIG. 4) adapted to provide field level measurements and alarms. Although various type antennas can be utilized, in the preferred embodiment, the multispectral RF head 30 comprises multiple planar type microstrip antennae having peak operational efficiencies at specific body resonance frequencies of interest.

More particularly, the microstrip antenna elements 30 comprise a sandwich of parallel conducting layers such as 32 and 34 which are separated by a thin dielectric substrate. The lower conductor layer 34 of each of the antenna elements functions as a ground plane while the other conductive layer 32 serves as a resonant patch. Depending upon overall design and efficiency requirements, the upper conductive layer 32 may be formed as either a rectangle as shown in FIG. 3 or alternatively in a circular, spiral, annular slot, annular strip or crossed-dipole configuration. In addition, the antenna geometry such as size, substrate thickness, dielectric constant and feedpoint location is of course related to antenna performance parameters such as resonant frequency, resonant resistance, band width, efficiency, polarization, and gain. In the preferred embodiment, the particular microstrip antenna 30 is adapted for use from 2 GHz to 15 GHz with gains in the 4 to 7 Db range. Of course, other antenna in the form of printed dipoles or printed logarithmic spirals could be used for frequencies between 900 MHz and 2 GHz as well as the higher frequencies of 15 to 30 GHz.

It is an important feature of the present invention that the particular microwave antenna 30 is capable of detecting microwave radiation at particular frequency bands. In particular, the present invention by specific antenna geometry and construction is adapted to monitor microwave radiation at partial body resonance frequencies which in the preferred embodiment comprise frequencies of 2.45 GHz, such as that typically associated with microwave oven operation, 3.0 GHz, 6 GHz, 10 GHz, such as that associated with radar x band operation and 15 GHz. As will be recognized by those skilled in the art, the capability of monitoring these specific hot spot frequency bands is made possible by overall antenna design as well as proper location of the electrical feeds to the antennae elements 30. In the preferred embodiment, the particular electrical feeds utilized on the multiple antenna elements 30 are located at points A for the 2.45 GHz frequency band, point B for the 3.0 GHz frequency band, point C for the 10 GHz, and point D for the 15 GHz frequency band. For improved monitoring capabilities, a separate C-band printed microstrip dipole antenna 31 is provided on the monitor 10 (as indicated in FIG. 3) for the 6 GHz band. In this regard, those skilled in the art will recognize that different locations for the feeds will be utilized depending upon overall antenna configuration and geometry.

Referring to FIG. 4, the detailed construction of the electronic circuity 60 of the present invention may be described. For purposes of illustration, the circuitry 60 is depicted as a single circuit connected to a single antenna source; however, those skilled in the art will recognize that the same circuit 60 will be duplicated for each of the multiple antenna detectors utilized in the invention. In the preferred embodiment, the circuitry 60 consists of a monolithic integrated circuit which is a combination of active and passive elements manufactured by a successive diffusion processes on a semiconductor substrate. The active elements are silicon planar chips while the passive elements are either thin or thick film components.

More particularly, the circuitry 60 comprises detector section 62 such as a diode or thermistor bridge connected in series to be a matching section 64 to generate a DC voltage signal to a DC amplifier 66. Depending upon overall design criteria, however, such matching section may or may not be required in the circuitry 60. The amplified voltage is segregated into two paths and fed to a decision circuit 68 and voltage to frequency converter 70. The decision circuit 68 includes an adjustable threshold for activating a field alarm while the voltage to frequency converter is used for digital field level measurements. A fast reset rate counter 72 designated as a field monitor counter is provided to render a digital display of the field level while a 0.1 hour reset counter 74 designated as an accumulated dose counter is provided to measure the accumulated dose over a predetermined 0.1 hour period and activate an alarm upon overflow. An accumulating counter 76 designated as the integrated dose counter is additionally provided to integrate the power over any time length up to a desired capacity and thereby provide an integrated dose display.

The circuit 60 additionally includes a self-test portion comprising a timer 80 to activate a RF oscillator 82 thereby periodically providing a short pulse of approximately 10 milliseconds duration at the RF diode 62 input. The various outputs of the field alarm, field monitor, and voltage frequency converter 70 are correlated by various latching mechanisms 84, 86, and 88 and a AND gate 90 to activate an alarm at disfunction of any of these components of the system.

Advantageously, a series of manual push button switches 100, 102, 104, 106, and 108 are provided on the display portion 22 of the monitor 10 which when manually depressed causes the output data stored in the circuitry 60 at respective frequency levels, i.e. 2.45 GHz, 3.0 GHz, 6.0 GHz, 10 GHz, and 15 GHz to be available for readout. The field alarm, field monitor display, accumulated dose alarm, and integrated dose display for each of the selected frequency levels may be then observed on the digital display 110 and warning light 112 positioned upon the display portion 22 of the monitor by merely depressing the field monitor counter 72, accumulated dose counter 74 and integrated dose counter 76 switches. A manual depression switch 114 may additionally be provided to activate the self-testing curcuitry of the circuit.

Thus, in summary, those skilled in the art will recognize that the present invention comprises a significant improvement in the art by providing an extremely small microwave monitor device 10 which may be easily carried by an individual 14. In addition, the device provides field alarms, field monitors, accumulated dose alarms, and integrated dose monitoring of microwave radiation exposure to an individual at certain hot spot frequencies. Although for purposes of description certain configurations and constructions have been defined herein, those skilled in the art will recognize that various modifications can be made to the same which modifications are clearly contemplated herein.

What is claimed is:

1. An improved microwave field monitoring device comprising:
    a housing adapted to be worn upon an individual;
    antenna means carried by said housing for detecting microwave radiation irradiated upon said housing at a specific microwave radiation band level;
    means responsive to said antenna means for accumulating and integrating the amount of radiation irradiated upon said housing over differing predetermined time periods;
    means for displaying the accumulated and integrated amount of radiation irradiated upon said housing for each of said differing time periods; and
    alarm means responsive to said accumulating and integrating means to alert the individual to exposure of predetermined quantities of radiation irradiated upon said housing in excess of safe exposure limits.

2. The device of claim 1 wherein said antenna means includes means for detecting microwave radiation at multiple discrete frequency band levels.

3. The device of claim 2 further comprising switch means for selectively permitting the display of said accumulating and integrating means for each of said multiple discrete frequency band levels.

4. The device of claim 3 wherein said antenna means comprises a microstrip antenna.

5. The device of claim 4 wherein said accumulating and integrating means comprises a monolithic integrated circuit.

6. The device of claim 5 further comprising means for pretesting said microwave integrated circuit to insure proper functioning of said circuit.

7. The device of claim 6 wherein said displaying means comprises a digital display device.

8. An improved microwave monitoring device comprising:
    a housing adapted to be worn upon an individual;
    antenna means disposed upon said housing adapted to detect microwave radiation at multiple specific partial body resonance frequency band levels;
    means responsive to said antenna means for determining the integrated and accumulated amount of microwave radiation exposed to the individual in a desired time period for each of said specific frequency band levels;
    alarm means response to said determining means for alerting the individual to quantities of radiation in excess of predetermined safe exposure levels of microwave radiation at each of said specific frequency band levels; and
    means for selectively displaying the accumulated and integrated amount of radiation irradiated upon said housing for each of said specific frequency band levels.

9. The device of claim 8 wherein said antenna means includes means for detecting microwave radiation at discrete multiple frequency band levels.

10. The device of claim 8 wherein said antenna means comprises a microstrip antenna.

11. The device of claim 10 wherein said alerting means includes a warning light adapted to be viewed by the individual.

12. The device of claim 11 wherein said alerting means includes an audible alarm.

* * * * *